United States Patent [19]

Casati et al.

[11] Patent Number: 5,445,995
[45] Date of Patent: Aug. 29, 1995

[54] METHOD FOR MANUFACTURING PLASTIC-ENCAPSULATED SEMICONDUCTOR DEVICES WITH EXPOSED METAL HEAT SINK

[75] Inventors: Paolo Casati, Sesto San Giovanni; Pierangelo Magni, Villasanta, both of Italy

[73] Assignee: SGS-Thomson Microelectronics, S.r.l., Agrate Brianza, Italy

[21] Appl. No.: 994,421

[22] Filed: Dec. 21, 1992

[30] Foreign Application Priority Data

Dec. 20, 1991 [IT] Italy .................. MI91A3440

[51] Int. Cl.⁶ ............................................. H01L 21/56
[52] U.S. Cl. ................................. 437/211; 437/212; 437/219; 437/902; 257/719; 257/720; 257/796; 264/272.17
[58] Field of Search ............. 437/212, 902, 219, 209, 437/211; 257/796, 719, 720; 264/272.17, 272.11, 272.1

[56] References Cited

U.S. PATENT DOCUMENTS

| | | | |
|---|---|---|---|
| 4,216,577 | 8/1980 | Badet et al. | 264/272.17 |
| 4,688,152 | 8/1987 | Chia | 264/272.17 |
| 4,822,550 | 4/1989 | Komathu . | |
| 4,887,149 | 12/1989 | Romano' | 257/796 |
| 4,951,124 | 8/1990 | Sawaya | 257/796 |
| 4,963,975 | 10/1990 | Sawaya | 257/796 |
| 5,091,341 | 2/1992 | Asada et al. | 437/212 |
| 5,157,478 | 10/1992 | Ueda et al. | 257/796 |
| 5,291,178 | 3/1994 | Strief et al. | 257/796 |

FOREIGN PATENT DOCUMENTS

| | | |
|---|---|---|
| 0548496 | 6/1993 | European Pat. Off. . |
| 2900114 | 2/1980 | Germany . |
| 1088535 | 5/1986 | Japan ................ 264/272.17 |
| 8128721 | 6/1987 | Japan ................ 264/272.17 |
| 0184040 | 7/1990 | Japan ................ 264/272.17 |
| 5326589 | 12/1993 | Japan . |

OTHER PUBLICATIONS

Patent Abstracts of Japan, vol. 015, No. 098 (E-1042) 8 Mar. 1991.

*Primary Examiner*—Olik Chaudhuri
*Assistant Examiner*—Long Pham
*Attorney, Agent, or Firm*—Robert Groover; Betty Formby

[57] ABSTRACT

A mold is disclosed for semiconductor devices intended for surface mounting, being of a type which comprises a metal plate and a body of solidified plastic resin. It consists of two plates which delimit at least one hollow adapted to receive the plate and to contain resin for forming the device body. Two elements of the mold push the plate from opposed sides against the bottom of the hollow. The hollow has two side extensions which are delimited by the side surfaces of the plate edges, thereby solidified projections are formed thereon which separate readily after the molding process. Thus, a structure is obtained wherein the plate has its bottom surface and two side edge portions fully exposed to allow optimum and controllable soldering to a printed circuit board.

20 Claims, 1 Drawing Sheet

METHOD FOR MANUFACTURING PLASTIC-ENCAPSULATED SEMICONDUCTOR DEVICES WITH EXPOSED METAL HEAT SINK

BACKGROUND AND SUMMARY OF THE INVENTION

This invention relates to the manufacture of semiconductor electronic devices, and mote particularly, to a mold and a method for manufacturing a semiconductor device structure intended for surface mounting and being of a type which comprises a metal plate and a plastic (solidified resin) body joined to each other.

As is known, integrated circuits and other active electronic devices or components are built up on chips of a semiconductor material having a surface area on the order of a few square millimeters, and require for their connection to an external electric circuit special supporting, enclosing and electric interconnection structures. A typical structure suited for the purpose basically comprises a solid resin body enclosing a chip which is connected, by thin wires soldered to metallized regions specially provided on its surface, to corresponding electric conductors or terminal leads led out of the polymer body. With power integrated circuits, that is devices designed to operate on high currents, and therefore, liable to become heated to a significant extent, such structures also comprise a small metal plate through which a chip mounted thereon can transfer the heat generated during its operation to the environment.

In manufacturing the last-mentioned structures, the plate is blanked from sheet metal, e.g. copper; thereafter, a chip is secured on the metal plate either by soldering with a low-melt alloy such as a lead-tin alloy, or by cementing with a suitable adhesive such as an epoxy adhesive; a set of metal strips, intended to become the terminal leads for the device, are then blanked off thin sheet metal but still left joined to one another by interconnecting sections, and mounted to the plate in an electrically insulated manner therefrom; thin wires, usually of gold, are soldered, on the one side, to the metallized regions of the chip using a low-melt alloy, and on the other side, welded to the ends of the metal strips using a so-called "thermosonic" process wherein heat and ultrasound are applied simultaneously; thereafter, the assembly is placed into a specially provided mold, into which a material such as a thermosetting epoxy resin is then introduced in a liquefied state; on curing the resin, a structure is obtained which comprises a solidified resign body encapsulating the above-described elements excepting for one face of the metal plate and part of the metal strips, i.e. of the device terminal leads, and their interconnecting sections; the latter are then removed, along with any interconnecting sections present, as by blanking to yield the finished electronic product.

With devices intended for surface mounting, that is for attachment to a printed circuit board by welding the heat sink and the lead ends to specially arranged metal regions, all located on the same board surface, the leads are bent to have their free ends all lying in the plane which contains the exposed side of the heat sink. The soldering is performed by applying a low-melt solder layer onto the metal regions of the board and then arranging the circuit components on the board with their respective terminals, and in the instance of devices of the kind described above, with the exposed side of the heat sink, in contact with the metal regions, and by heating the board to melt the solder layers and thereby have the terminals and heat sinks soldered on cooling to their respective metal regions.

The soldered joint quality is then inspected for appearance and shape. With semiconductor devices which incorporate a heat sink, this inspection cannot be carried out (or can be carried out only imperfectly) because the border line between the heat sink and the solder are concealed from view. Further, checking that the heat sink is correctly aligned to the corresponding printed circuit area also becomes more difficult due to that border line being hidden from view.

To obviate such drawbacks, structures have been proposed wherein the metal plate of the heat sink has exposed edges on two opposed sides of the structure. To make such structures, however, a special, critical and troublesome, additional machining step is required to rid such opposed edges of the solidified resin that forms all around the plate during the molding process.

Another machining step which becomes usually necessary to prepare such structures for soldering is the removal of thin polymer layers which form on the outward side of the heat sink due to seepage during the molding process. To prevent such seepage, there are known molds having shaped interiors to present elements for pushing the metal plate against the bottom of the hollow wherein the solidified resin body of the structure is to be formed.

It is the object of this invention to provide a method for manufacturing packaged device structures without post-machining to remove solidified resin that has seeped onto the heat sink nor any other troublesome machining to remove solidified resin from the heat sink edges.

The present application provides a manufacturing method, for packaging integrated circuits, in which the back of the heat sink plate is left substantially free of solidified resin. Moreover, a clean metal surface is easily achieved at the edge of the heat sink plate. Note that this clean metal surface is adjacent to a relief in the solidified resin encapsulation body. Thus, the quality of the solder joint can easily be inspected at this location.

In the presently preferred embodiment, this is achieved using a mold which includes two plates which delimit at least one hollow adapted to receive the plate and to contain resin for forming the device body. Two elements of the mold push the down, at opposite ends of the top surface of the plate, to hold the plate against the bottom of the hollow. The hollow has two side extensions which are delimited by the side surfaces of the plate edges, thereby solidified resin projections are formed thereon which separate readily after the molding process. Thus, a structure is obtained wherein the plate has its bottom surface and two side edge portions fully exposed to allow optimum and controllable soldering to a printed circuit board.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
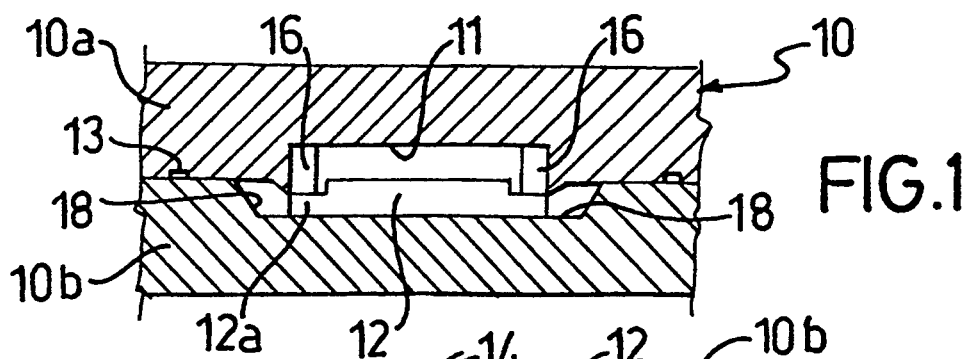
FIG. 1 is a cross-sectional view through a portion of the mold according to the invention.
Figure 2:
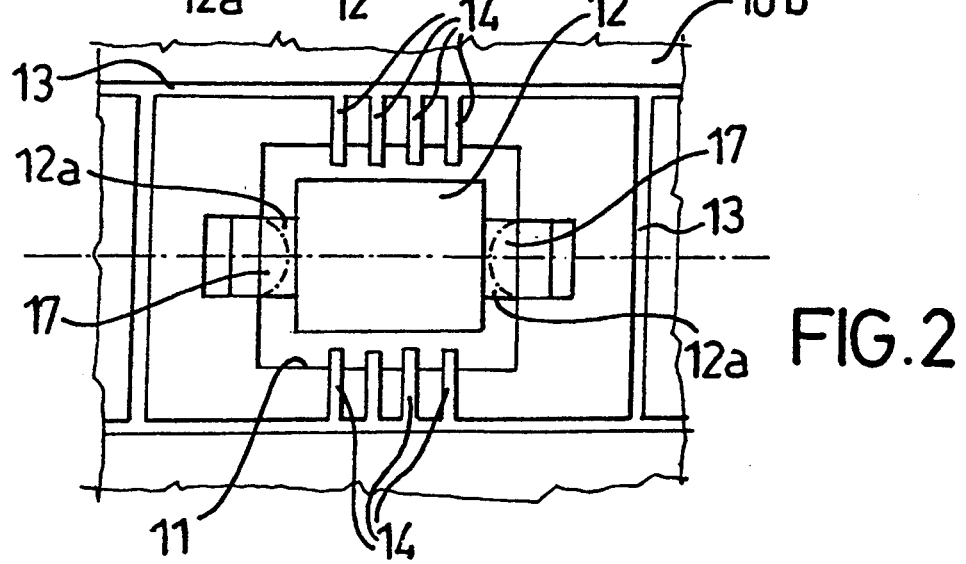
FIG. 2 is a plan view of the lower plate of the mold shown in FIG. 1.

With particular reference to FIGS. 1 and 2, a mold, generally denoted by 10, comprises two superimposable plates or halves 10a and 10b. The two half-molds, when superimposed on each other, will delimit on their interiors hollows which are connected to an inlet by suitable channels, not shown. Through these channels, a resin material, such as a thermosetting epoxy resin, in a liquefied state can be injected into the hollows under pressure to fill them.

Shown in FIG. 1 is a mold portion having a hollow 11 formed of two compartments correspondingly provided in the two mold halves. A blank piece comprising a metal plate 12, a chip of a semiconductor material attached to the plate, and a framework 13 of leads 14 electrically connected to the chip is placed into the lower compartment. In the interest of simplicity, the drawing FIGS. 1 and 2 only show the metal plate 12 and the framework 13. It can be seen that the plate 12 is formed of a broad portion, rectangular in shape, and two wings 12a which extend from the small sides of the rectangle and are slightly sunk with respect to the top surface of the plate.

The upper mold half 10a has two pusher elements 16 which, with the mold closed and the blank piece placed within the hollow, engage surface areas 17 of the plate with their free ends so as to hold it pressed against the hollow bottom.

The lower compartment of the hollow 11 extends sideways into two recesses 18 which, with the plate 12 inserted into its socket in the lower mold half 10b, are covered by the thickness of the wings 12a, specifically by the side surfaces of their end edges, extend inside the lower mold half, and are covered at the top by a flat portion of the upper mold half 10a. They are also communicated to the resin inlet by channels, not shown.

Figure 3:
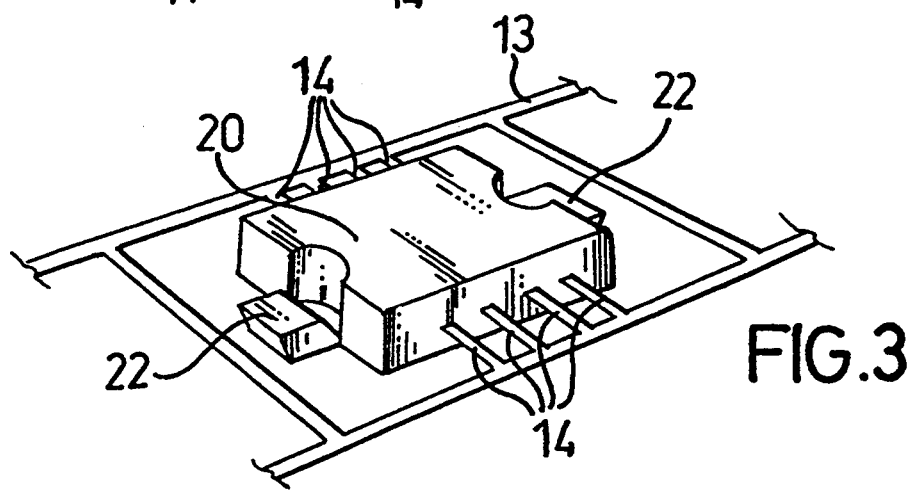
FIG. 3 is a perspective view of a semiconductor device structure as it appears directly after molding.

As the resin is injected into the mold in a liquefied state, it fills the hollow completely, including its side extensions 18. After curing, a structure like that shown in FIG. 3 is taken out of the mold. It consists of a solidified resin body 20 whence the metal strips 14 of the device terminal leads protrude (still held together by the framework 13). The body 20 encapsulates the plate 12 to leave free only its bottom surface (not shown in the drawing). This bottom surface was held in contact with the bottom of the hollow during the molding process. The structure also has two projections 22, formed by resin which flowed into the recesses 18. These projections joined to the remainder of the structure only along the edges of the wings 12a of the metal plate 12. According to the invention, these are then separated from the remainder of the structure using a suitable tool. This is not a precision operation: the projections are simply hit centrally with a punch to knock them off.

The dimensions of a sample embodiment include: plastics body 20: $11 \times 16 \times 3.2$ mm; heat sink plate (not including wings 12a): $7 \times 13.5 \times 1.2$ mm; wings 12a: $1.2 \times 2.8 \times 1$ mm thick.

Figure 4:
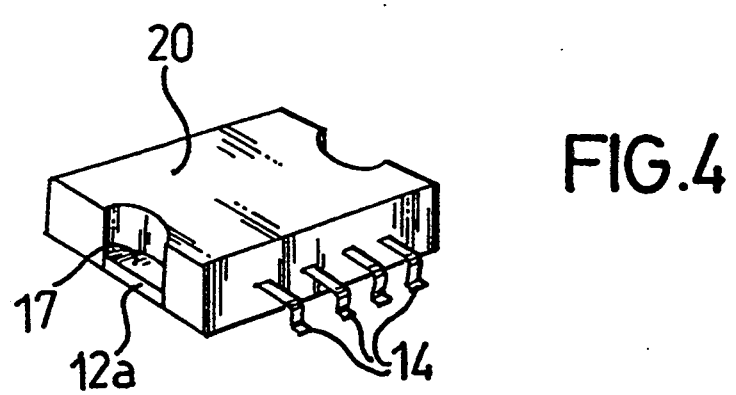
FIG. 4 is a perspective view of a finished semiconductor device structure as obtained using the mold and method of this invention.

Thereafter, the sections of framework 13, which had been holding the leads together, are shorn off. Finally, the leads are bent over as shown in FIG. 4 so that their end portions will lie in the bottom plane of the structure. The packaged device is now ready to be soldered to a surface of a printed circuit board.

Thus, the mold and method of this invention provide a device which is ready for surface mounting with no post-machining apart from the simple separation of the projections 22. The surface of the heat sink is free of any traces of resin from seepage due to the elements 16 being pressed against the plate 12, and the edges of the latter are (within the span of the wings) completely free of resin. Notice that the thickness of the wings 12a is reduced, conveniently, from that of the remainder of the plate 12 to both facilitate separation of the projections 22 and improve the mechanical anchoring of the resin body 20 on the plate 12.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

While a single embodiment of the invention has been described and illustrated, it is understood that many variations and modifications are possible within the same overall inventive concept. AS an example, the pusher elements 16 could be constructed such that the surfaces 17 of the plate contacting them have shapes and dimensions other than those shown, and as a result, the wings 12a also have shapes and breadths other than those shown, it being possible, in the extreme, to extend them to span the full width of the plate 12.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for manufacturing packaged integrated circuit devices, comprising the steps of:
   (a.) providing a heat sink plate;
   (b.) affixing an integrated circuit to a first surface of said heat sink plate;
   (c.) bonding said integrated circuit to multiple leads of a lead frame;
   (d.) placing said heat sink plate, said integrated circuit, and portions of said leads within a mold, and closing said mold;
     (i.) wherein said mold includes multiple pushing elements which press against known locations of said first surface of said plate at opposite ends thereof when said mold is closed;

(ii.) wherein said mold further includes cavities adjacent to said known locations at opposite ends of said plate;

(e.) injecting resin into said mold, and thereby forming a body encapsulating said integrated circuit, and also thereby forming projections adhering to edges of said plate adjacent to said known locations; and (f.) trimming said projections from the edges of said plate, to leave clean metal surfaces exposed.

2. The method of claim 1, further comprising the additional step, after said step (e.), of trimming off outer portions of said lead frame, to leave multiple ones of said leads electrically separate.

3. The method of claim 1, wherein, during said step of emplacing said lead frame, said lead frame is mechanically attached to said plate.

4. The method of claim 1, wherein multiple linked ones of said lead frames are simultaneously emplaced onto multiple ones of said molds.

5. The method of claim 1, wherein multiple linked ones of said heat sink plates are simultaneously emplaced onto multiple ones of said molds.

6. The method of claim 1, further comprising the additional step of curing said resin to form a durable solid material.

7. A method for manufacturing packaged integrated circuit devices, comprising the steps of:

(a.) providing a metal heat sink plate;

(b.) soldering a semiconductor integrated circuit to a first surface of said metal heat sink plate;

(c.) electrically connecting said integrated circuit to multiple leads of a lead frame;

(d.) emplacing said metal heat sink plate, said integrated circuit, and portions of said leads within a mold, and closing said mold;

(i.) wherein said mold includes multiple pushing elements which press against multiple known locations of said first surface of said metal heat sink plate when said mold is closed;

(ii.) wherein said mold further includes cavities adjacent to the edge of said metal heat sink plate, in proximity to said known locations;

(e.) injecting resin into said mold, and thereby forming a body encapsulating said integrated circuit, and also thereby forming projections adhering to edges of said metal heat sink plate adjacent to said known locations; and (f.) trimming said projections from the edges of said metal heat sink plate, to leave clean metal surfaces exposed.

8. The method of claim 7, further comprising the additional step, after said step (e.), of trimming off outer portions of said lead frame, to leave multiple ones of said leads electrically separate.

9. The method of claim 7, wherein, during said step of emplacing said lead frame, said lead frame is mechanically attached to said plate.

10. The method of claim 7, wherein multiple linked ones of said lead frames are simultaneously emplaced onto multiple ones of said molds.

11. The method of claim 7, wherein multiple linked ones of said heat sink plates are simultaneously emplaced onto multiple ones of said molds.

12. The method of claim 7, further comprising the additional step of curing said resin to form a durable solid material.

13. A method for manufacturing packaged integrated circuit devices, comprising the steps of:

(a.) providing a metal heat sink plate;

(b.) affixing a first surface of a semiconductor integrated circuit to a first surface of said metal heat sink plate;

(c.) placing a lead frame in proximity to and surrounding said integrated circuit, and forming wire connections from multiple contact pads on a first surface of integrated circuit to multiple leads of said lead frame;

(d.) emplacing said metal heat sink plate, said integrated circuit, and portions of said leads in a mold, and closing said mold;

(i.) wherein said mold includes one or more pushing elements which press against multiple known locations of said first surface of said metal heat sink plate;

(ii.) wherein said mold further includes one or more cavities laterally adjacent to the edge of said metal heat sink plate, each in proximity to a respective one of said known locations;

(e.) injecting resin into said mold, and thereby forming a body encapsulating said integrated circuit, and also thereby forming projections adhering to edges of said metal heat sink plate adjacent to said known locations; and (f.) trimming said projections from the edges of said metal heat sink plate, to leave clean metal surfaces exposed.

14. The method of claim 13, further comprising the additional step, after said step (e.), of trimming off outer portions of said lead frame, to leave multiple ones of said leads electrically separate.

15. The method of claim 13, wherein, during said step of emplacing said lead frame, said lead frame is mechanically attached to said plate.

16. The method of claim 13, wherein multiple linked ones of said lead frames are simultaneously emplaced onto multiple ones of said molds.

17. The method of claim 13, wherein multiple linked ones of said heat sink plates are simultaneously emplaced onto multiple ones of said molds.

18. The method of claim 13, further comprising the additional step of curing said resin to form a durable solid material.

19. A method for manufacturing a semiconductor electronic device structure comprising a metal plate having first and second flat surfaces and an electronic device mounted on said second surface and a solidified resin body which encapsulates the plate while leaving said first flat surface exposed, comprising the steps of:

introducing said metal plate into a hollow of a mold which includes two superimposable plates jointly delimiting said hollow, and wherein said hollow is adapted to receive said metal plate with said first flat surface held in contact with a bottom wall of said hollow and to contain a sufficient amount of resin to form said body, and wherein said mold includes means to push said metal plate against said bottom wall while engaging one or more surface areas thereof delimited by said second flat surface, wherein one or more portions of said hollow define extension(s) which, with the mold closed and the plate inserted into said hollow, are delimited by the lateral surface of said plate side and the inner walls of said mold;

injecting resin, in a liquefied state, into said hollow;

curing the resin; and taking out of the mold a device consisting of said metal plate and the solidified resin body resulting from the preceding steps; and removing the portion(s) of polymer formed in said extension(s) of said hollow while separating them from their respective side surfaces of said plate.

20. A method according to claim 19, characterized in that the blank Piece is obtained from a substantially quadrilateral-shaped metal plate having two wings which extend from two opposed sides, the end sides of such wings defining said side surfaces of the plate.

* * * * *